United States Patent [19]

Kannegundla

[11] Patent Number: 4,761,565
[45] Date of Patent: Aug. 2, 1988

[54] CCD CLOCK DRIVER CIRCUIT

[75] Inventor: Ram Kannegundla, Rochester, N.Y.

[73] Assignee: Eastman Kodak Company, Rochester, N.Y.

[21] Appl. No.: 67,749

[22] Filed: Jun. 29, 1987

[51] Int. Cl.[4] .................................. H03K 17/12
[52] U.S. Cl. .................................. 307/243; 307/242; 307/270; 307/480; 307/481; 307/585; 377/61
[58] Field of Search ............ 307/200 A, 200 B, 443, 307/448, 451, 454, 480–481, 242–243, 246, 570, 579, 584, 585, 270; 361/58; 377/60–61; 330/295

[56] References Cited

U.S. PATENT DOCUMENTS

| | | | |
|---|---|---|---|
| 3,963,993 | 6/1976 | Hoffman et al. | 330/295 X |
| 4,081,757 | 3/1978 | Rumbaugh | 330/295 X |
| 4,329,600 | 5/1982 | Stewart | 307/270 X |
| 4,344,001 | 8/1982 | Tsuchiya et al. | 377/61 |
| 4,419,593 | 12/1983 | Butler et al. | 307/268 |
| 4,424,456 | 1/1984 | Shiraki et al. | 307/268 |
| 4,477,741 | 10/1984 | Moser, Jr. | 307/270 X |
| 4,486,672 | 12/1984 | Nishimura et al. | 307/270 X |
| 4,487,457 | 12/1984 | Janutka | 307/242 |
| 4,644,184 | 2/1987 | Miyawaki et al. | 307/584 X |
| 4,684,824 | 8/1987 | Moberg | 307/246 X |
| 4,707,620 | 11/1987 | Sullivan et al. | 307/270 |

*Primary Examiner*—Stanley D. Miller
*Assistant Examiner*—D. R. Hudspeth
*Attorney, Agent, or Firm*—Raymond L. Owens

[57] ABSTRACT

A high-speed CCD clock driver circuit is obtained by coupling a plurality of driver circuits in parallel, with each driver circuit including a short circuit protection circuit consisting of the parallel connection of a resistor and a diode. In a further embodiment, a plurality of pre-driver circuits are connected in parallel to provide drive to the parallel-connected driver circuits.

4 Claims, 5 Drawing Sheets

CCD CLOCK DRIVER CIRCUIT

FIELD OF THE INVENTION

The present invention relates to clock driver circuits for charge coupled devices.

BACKGROUND OF THE INVENTION

Charge coupled devices (CCD's) are used in various fields such as solid state imaging, analog signal processing, analog delay lines and memories for analog and digital signals. In the process of transferring signals either to or from the cells of the CCD, the CCD presents a capacitive load to clock drivers. Transferrng signals in the form of charge packets from one location to the next of a CCD or from a CCD to an external processing circuit is called charge transfer. The efficiency with which a charge packet is transferred is referred to in the art as "charge transfer efficiency." In order to have effective use of such CCD's, the charge transfer efficiency should be as high as possible.

The signal, in form of a charge packet, is transferred from one location to another by the application of an input pulse through a clock driver circuit. The function of the clock driver circuit is to provide a signal to the CCD at various required voltage levels with proper rise and fall times. Each cell has a certain capacitance. The total capacitive load presented to a clock driver circuit is linearly proportional to the number of cells. CCD's are often used for video applications. Typically charge packets are clocked out line by line every 63.5 µs (line rate) and clocked out pixel by pixel at the pixel rate which depends upon the number of pixels in each line. The clock driver circuits used for CCD's are generally divided into two types, namely a vertical clock driver circuit and a horizontal clock driver circuit. Each of these circuits normally has two phases. Each place drives a different channel that is 180° apart from the other channel. That is the first channel is at a high level while the second channel is at a low level and vice versa. The vertical clock drivers see many more cells and hence a relatively high capacitive load during transfer. The rate of transfer is at a low frequency. The horizontal clock drivers see a much lower capacitance (fewer cells) in the order of 50 to 100 pF.

A problem is to clock out the entire CCD at a rate often of 10 MHz or higher. At such frequencies the load seen by the clock drivers can be in the order of 5,000 to 10,000 pF or even more. Such a capacitive load requires 10 or more amperes of current with a 2 amp/ns rise and fall time. In addition, the fast rise and fall times are particularly necessary for high speed operation of CCD's used in electronic imaging.

A conventional prior art driver circuit for a high speed CCD is shown in FIG. 1. Two switching transistors, $Q_1$ and $Q_2$, are connected, in series. At the junction of these transistors, an output current is provided which charges a capacitive load. The capacitor C represents the capacitive load of the CCD. Coupling capacitors $C_1$ and $C_2$, in response to the input signal are charged and discharged to cause transistors $Q_1$ and $Q_2$ to be alternately switched ON and OFF. Diodes $D_1$ and $D_2$ are used to perform charging and discharging of the coupling capacitors $C_1$ and $C_2$ and thereby prevent transistors $Q_1$ and $Q_2$ from being damaged. In operation when transistor $Q_1$ is ON, transistor $Q_2$ is OFF and then capacitor C is charged. When the transistor $Q_1$ is turned OFF and transistor $Q_2$ is turned on, capacitor C discharges through the transistor $Q_2$ to ground. This circuit was actually tested using very fast switching transistors and was only able to drive a maximum load of about 1,000 pF at 10 MHz.

In order to appreciate the present invention, it will be helpful to briefly analyze the characteristics of capacitive loads. FIG. 2A depicts a constant current source $I_S$ for charging a capacitor C. At time $t=t_0$, the switch S is closed and the charging cycle begins. The voltage across the capacitor C is given by:

$$V_C = \frac{\int i_S \, dt}{C} + V_0 \quad (1)$$

The current is given by the well known formula:

$$i_S = \frac{C dv_C}{dt} \quad (2)$$

To charge the capacitor C to 5 volts in 5 nS, the current $I_S$ required is tabulated in Table I.

TABLE I

| C in pf | $i_S$ in Amps |
|---------|---------------|
| 100     | 0.1           |
| 1,000   | 1             |
| 5,000   | 5             |
| 10,000  | 10            |

Referring to FIG. 2B, which is a model of a constant voltage source for charging a capacitor C, the voltages across the capacitor after the switch is closed, is given by (where $V_0=0$):

$$i_S + \frac{1}{C} \int i \, dt = V_S$$

where i is the instantaneous current. Solving this differential equation one obtains:

$$i = V_S/R_S \cdot e^{-t/R_S C} \quad (3)$$

The current i at the time the switch S is closed ($t=0$) is given by $V_S/R_S$. Clearly from equation 3 at time $t=0$, with $R_s=0$, the current i is infinite. Thus at the time $t=0$, the capacitor C acts as a short circuit. Consequently, the switch S can be damaged without protection. For any solid state switch to charge a capacitor, it needs short circuit protection. Many devices which have been developed to drive capacitive loads, work without protection because the "on" resistance of the transistor, although small, protects it for short duration spikes. To drive high capacitive loads at high frequencies, the switch should have very little propogation delay and a high current capability. There are no switching transistors which presently can fulfill both these conditions. For a specific example, if as shown in FIG. 3, a switching transistor can drive a maximum of 100 mA without damage to itself, then for a supply of 5 volts, a 50 ohms resistor in series with the switching transistor will provide short circuit protection in accordance within equality (4):

$$R \geq \frac{V_D}{i_{max}} \quad (4)$$

where $i_{max}$ is the absolute maximum collector current of transistor.

By paralleling a plurality of transistors shown in FIG. 3, the total charging current going into any capacitor can be equal to the sum currents drawn by each transistor. This arrangement is not practical to use in operating a CCD since it provides no ready means to discharge the capacitor.

The CCD clock driver circuit shown in FIG. 1 can be schematically represented as shown in FIG. 4. Shown there are two separate switches $S_1$ and $S_2$ which, of course, may be embodied by switching transistors $Q_1$ and $Q_2$. When switch $S_1$ is closed, the CCD receives charging current and eventually reaches the upper supply voltage $+V$ with the time constant of RC. When $S_1$ is open and $S_2$ is closed, the CCD will discharge through the switch $S_2$ and reach the lower supply voltage $-V$. Switches $S_1$ and $S_2$ are complementary and should not be on at the same time. Failure of these switching transistors at high frequencies for large capacitive loads is a problem that has been solved by the present invention.

SUMMARY OF THE INVENTION

It is an object of the present invention to provide a clock driver circuit which can be used to drive both high and low capacitive loads at high speeds.

Another object of the present invention is to provide a high speed clock driver circuit which can also be quite effectively used for low capacitance loads which require fast rise and fall times.

The above objects are achieved in a clock driver circuit for a CCD capacitive load which in response to input clock signal provides driving current into such load. The clock driver circuit includes a plurality of driver circuits connected in parallel, each having an input and an output and two switching transistors connected in series which alternately change state in response to the level of said clock signals; a separate resistor and a diode connected in parallel to the output of each driver circuit to provide short circuit protection for at least one of the two switching transistors of each driver circuit; and the output of each driver circuit being connected to provide charging current to said capacitive load.

A feature of the present invention is that the clock driver circuits can be selected from commercially available high speed logic families, such as Advanced Schottkey TTL, High Speed CMOS and Hybrid Circuits.

Circuits in accordance with the present invention have been made to operate CCD's at low loads, such as 100 pF at 40 MHz and high loads, such as 5,000 pF at 10 MHz.

IN THE DRAWINGS

Figure 5A:
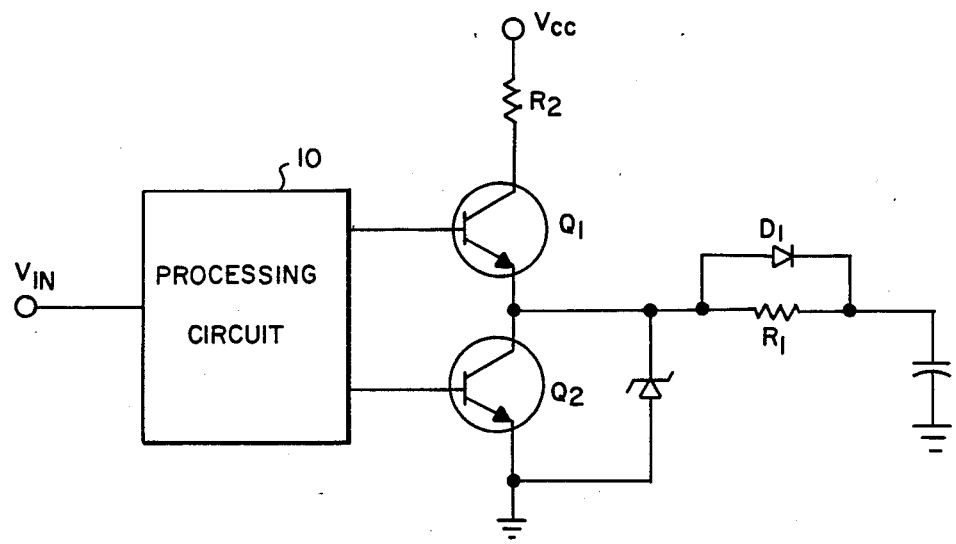
Figure 5B:
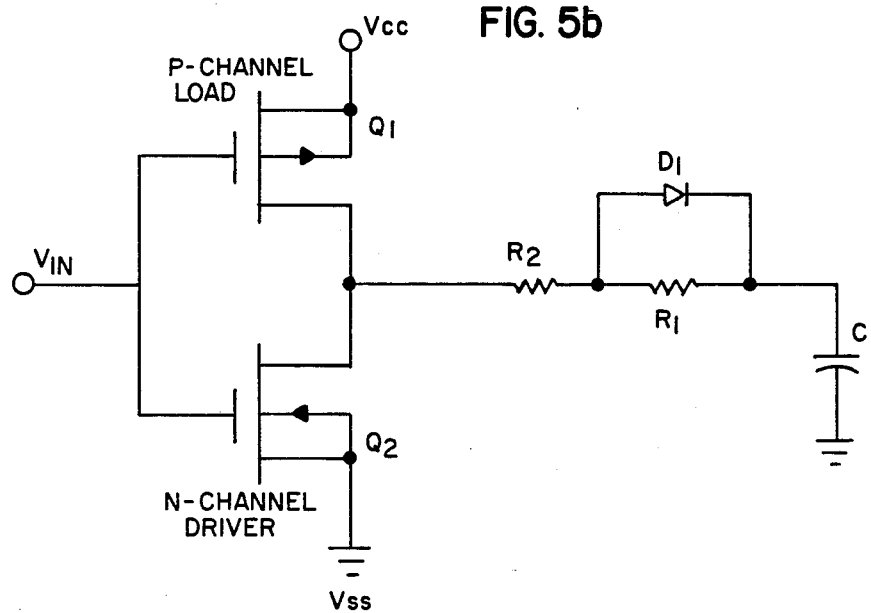
Figure 6:
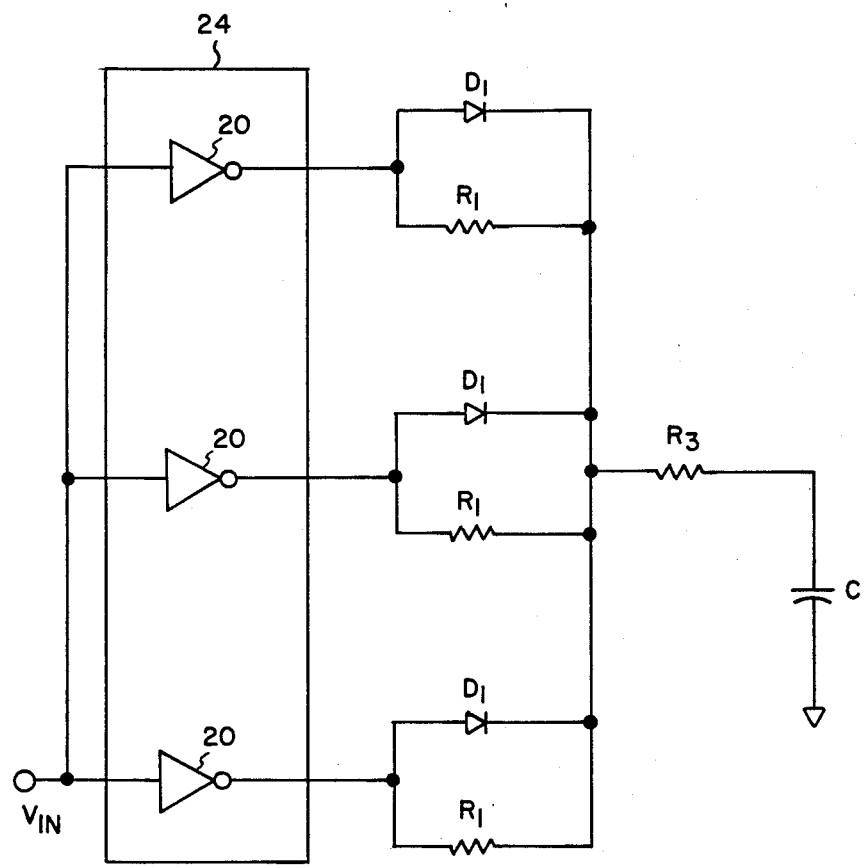
Figure 7:
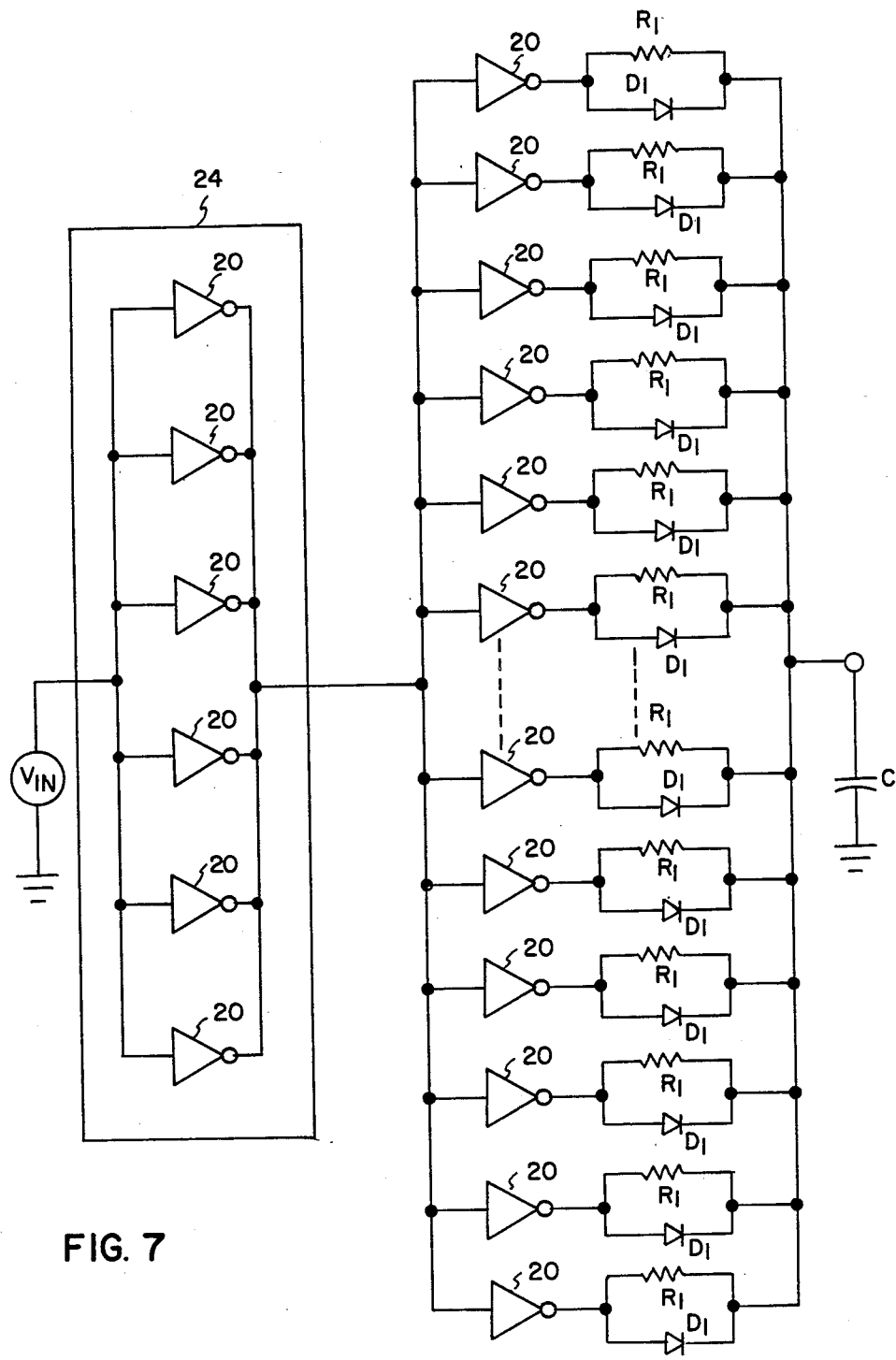

FIGS. 5A and 5B respectively depict different driver circuits in accordance with the invention; and FIGS. 6 and 7 respectively show two different clock driver circuits for utilizing the driver circuits of FIGS. 5A and 5B.

DETAILED DESCRIPTION OF THE PREFERRED EMBODIMENT

Figure 1:
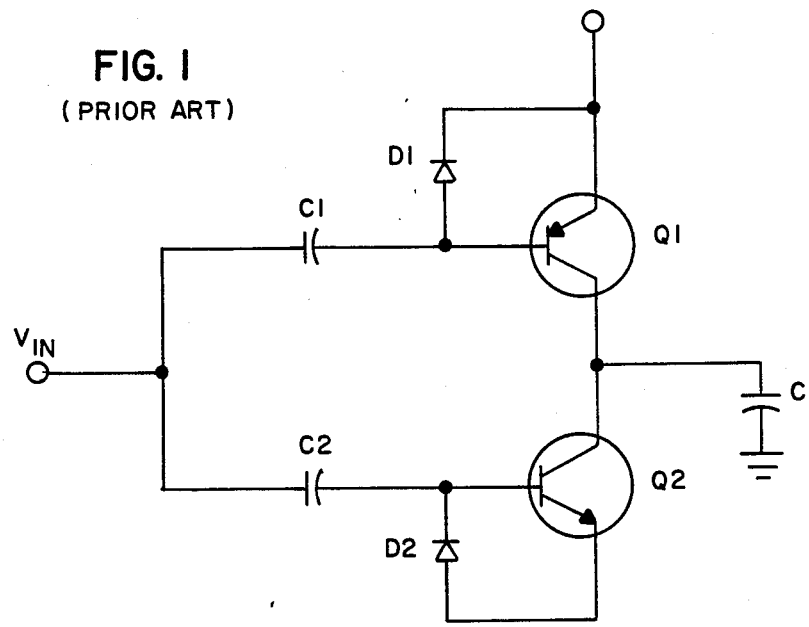
FIG. 1 is a schematic of a prior art clock driver circuits.
Figures 2A, 2B:
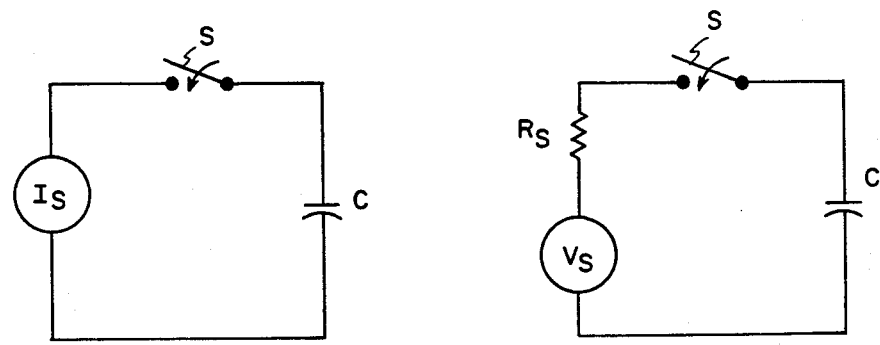
FIG. 2A is a model of a constant current source for charging a capacitor C.
FIG. 2B is a model of a constant voltage source for charging a capacitor C.
Figure 3:
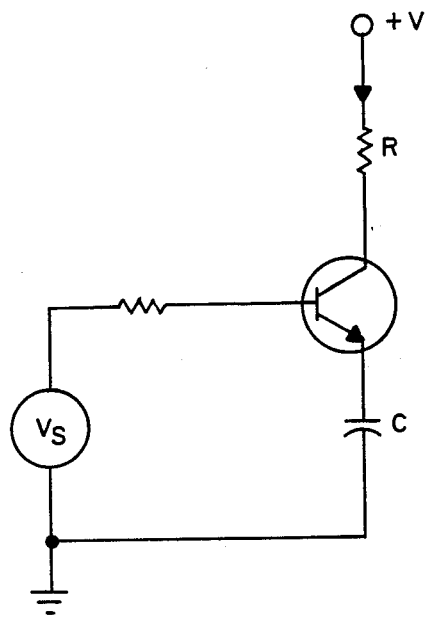
FIG. 3 is a model for providing short circuit protection for a transducer which charges a capacitor.
Figure 4:
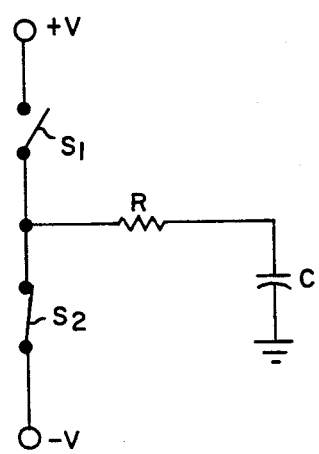
FIG. 4 is a schematic model of a clock driver circuit for charging a capacitor C which represents a CCD.

FIG. 5A is a circuit diagram of a driver circuit in accordance with the invention. The switching transistors $Q_1$ and $Q_2$ are the equivalent of switches $S_1$ and $S_2$ of FIG. 4. An input voltage $V_{in}$ is applied to a processing circuit 10 which in turn gives voltage signals to the bases of transistors $Q_1$ and $Q_2$, alternatively. In order to operate a CCD, depicted as a single capacitor C, the transistor $Q_1$ is turned on by the processing circuit when the transistor $Q_2$ is turned off. A circuit path is created from the potential $V_{cc}$, a resistor $R_2$, transistor $Q_1$ and a diode $D_1$ to the capacitor C. The resistor $R_2$ has been selected to provide protection for the transistor $Q_1$. In the event the resistor $R_2$ is not provided, then it could be provided directly adjacent to the parallel combination of diode $D_1$ and $R_1$ such as shown in FIG. 5B. In order to discharge the capacitor C, the transistor $Q_1$ is turned off and the transistor $Q_2$ is turned on. A circuit path is now created from the capacitor C through resistor $R_1$ and transistor $Q_2$ to ground. Resistor $R_1$ provides protection for transistor $Q_2$.

Turnng now to FIG. 5B we see a CMOS inverter driver circuit. The two FET switching transistors $Q_1$ and $Q_2$ are connected in series. When input $V_{in}$ is a low level voltage, generally the same potential as $V_{SS}$, the P-channel transistor $Q_1$ is turned on, but the N-channel transistor $Q_2$ is turned off. Charging current flows from the potential source $V_{DD}$ through transistor $Q_1$ resistor $R_2$ and diode $D_1$ into capacitor C. In order to discharge the capacitor C, the input signal $V_{in}$ is turned high and the P-channel transistor $Q_1$ is turned off and the N-channel transistor $Q_2$ is turned on. The capacitor C is discharged through the series connections of resistors $R_1$ and $R_2$ to $V_{SS}$. In this case the resistor $R_2$ is provided to protect the transistor $Q_3$ and both resistors $R_1$ and $R_2$ protect transistor $Q_2$.

An example of a commercially available driver circuit which is shown in FIG. 5A, without the diode $D_1$ and resistor $R_1$, is Fairchild's advanced Schottkey Chip Model 74FO4 which is actually a series of six inverter circuits on a chip referred to in the art as a hex inverter. Each invertor circuit has two switching transistors. For each inverter circuit, the parallel connection of diode $D_1$ and resistor $R_1$ is needed to provide the appropriate transistor protection.

Turning now to FIG. 6, we see a clock driver circuit which has been constructed to operate a CCD having 100 Pf (represented as a capacitor C) and operating at 40 Mhz. Three driver circuits in the form of inverter gates 20 were provided by a Fairchild's chip 74FO4 were connected in parallel to receive an input voltage $V_{in}$. All of the inverters were provided with appropriate protection, with the parallel combination of $D_1$ and $R_1$. $R_1$ was selected to be at 43 ohm resistance. A resistor $R_3$ (10 ohms) was connected in series with the CCD to compensate for the inductance of the small connecting wire. Rise time for this circuit was 8 ns.

Turning now to FIG. 7, we see a clock driver circuit which includes six inverters gates 20 of a hex inverter circuit 24 which respond to an input clock signal $V_{in}$ at 10 MHz. These six invertor gates 20 are connected in parallel and act as a single driver for the individual driver circuits which can be provided by for example eight packages of Fairchild's 74FO4's hex inverters. The invertor driver circuits 20 were also connected in parallel. All the inputs of these invertor gates are connected together. The output of each of these 48 gates are also connected to their own parallel combination of resistor $R_1$ and diode $D_1$. In this particular arrangement, the clock driver circuit drove a load of 5,200 Pf. In another embodiment of the invention by using 16 packages of hex inverters, a load of 10,000 Pf was effectively driven.

It will also be understood that instead of using CMOS logic, NMOS switching transistors can also be used in accordance with the invention. In fact the integrated circuit DS0026 manufactured by National Semiconductors or its equivalents may also be employed in a similar fashion to that of Fairchild's 74F04 hex invertors discussed above.

I claim:

1. A clock drive circuit for a CCD capacitive load which in response to an input clock signal provides driving current into such load, comprising:
   (a) a plurality of driver circuits connected in parallel, each having an input and output and two switching transistors connected in series which alternately change state in response to the level of said clock signal;
   (b) a resistor and a diode connected in parallel between the series connection of the two switching transistors and the output of the driver circuit; and
   (c) the input of each driver circuit being commonly connected to receive said input clock signal, and the output of each driver circuit being commonly connected to provide charging current to said capacitive load.

2. The invention as set forth in claim 1 wherein each said driver circuit is a CMOS circuit having two switching FETs.

3. A clock driver circuit for a CCD capacitive load which in response to an input clock signal provides driving current into such load, comprising:
   (a) a plurality of first driver circuits connected in parallel each having a common input and a common output and two switching transistors connected in series which alternately change state in response to the level of said clock signal, the inputs of said first driver circuits being connected to receive said clock signal;
   (b) a parallel combination of a resistor and a diode connected between the series connection of the two switching transistors and the output of each of said first driver circuits to provide short circuit protection for at least one of such first driver circuits switching transistors; and
   (c) the outputs of each of said first driver circuits being connected to provide charging current to said capacitive load.

4. The invention as set forth in claim 3 including a plurality of second driver circuits responsive to said clock signal and having outputs commonly connected to provide an input signal to each of said plurality of first driver circuits.

* * * * *